US012752380B2

United States Patent
(12) United States Patent
Fettke et al.

(10) Patent No.: US 12,752,380 B2
(45) **Date of Patent: *Oct. 6, 2026**

(54) BONDING HEAD AND BONDING APPARATUS

(71) Applicant: Pac Tech—Packaging Technologies GmbH, Nauen (DE)

(72) Inventors: Matthias Fettke, Berlin (DE); Andrej Kolbasow, Paulinenaue (DE); Thorsten Krause, Hoppegarten (DE); Svetlana Milz, Berlin (DE)

(73) Assignee: Pac Tech—Packaging Technologies Gmbh, Nauen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 19/243,598

(22) Filed: Jun. 19, 2025

(65) Prior Publication Data

US 2025/0367743 A1 Dec. 4, 2025

Related U.S. Application Data

(63) Continuation of application No. 18/202,881, filed on May 26, 2023, now Pat. No. 12,358,084.

(30) Foreign Application Priority Data

Apr. 26, 2023 (DE) ......................... 102023110696.1

(51) Int. Cl.
*B23K 1/00* (2006.01)
*B23K 1/005* (2006.01)
(Continued)

(52) U.S. Cl.
CPC ........ *B23K 37/0408* (2013.01); *B23K 1/0056* (2013.01); *B23K 26/04* (2013.01);
(Continued)

(58) Field of Classification Search
CPC ........................... B23K 37/0408; B23K 26/04; B23K 26/1462; B23K 26/20; B23K 26/702;
(Continued)

(56) References Cited

U.S. PATENT DOCUMENTS

| | | | | |
|---|---|---|---|---|
| 7,803,661 B2 | 9/2010 | Kim | H01L 21/44 | 438/108 |
| 8,685,833 B2 | 4/2014 | Khanna et al. | H01L 21/30 | 438/457 |

(Continued)

FOREIGN PATENT DOCUMENTS

| | | | |
|---|---|---|---|
| CN | 1780533 A * | 5/2006 | B23K 3/0623 |
| CN | 101152680 A * | 4/2008 | H05K 3/3478 |

(Continued)

OTHER PUBLICATIONS

Office action of the Japanese Patent Office in the related Japanese patent application JP2023-080943 dated May 28, 2024, as well as the English translation of the Japanese Office action (13 pages).

(Continued)

*Primary Examiner* — Kiley S Stoner
(74) *Attorney, Agent, or Firm* — Imperium Patent Works; Darien K. Wallace

(57) ABSTRACT

A bonding head for holding a substrate to be soldered includes a laser source, a vacuum source, a main body and a holding nozzle. A laser duct extends through the main body to a laser exit. The vacuum source creates a vacuum in the laser duct. The laser source directs the laser beam through the laser duct towards the laser exit. The holding nozzle is connected to the main body. A nozzle duct extends through the holding nozzle from a nozzle entry to a nozzle exit. The nozzle entry is adjacent to the laser exit. The holding nozzle is configured to hold the substrate at the nozzle exit when the vacuum source creates the vacuum in the laser duct. The laser beam passes through the nozzle duct and is directed
(Continued)

towards the substrate. The holding nozzle is configured to hold the substrate over a mounting face of a second substrate.

21 Claims, 6 Drawing Sheets

(51) Int. Cl.

| | |
|---|---|
| ***B23K 3/00*** | (2006.01) |
| ***B23K 26/04*** | (2014.01) |
| ***B23K 26/14*** | (2014.01) |
| ***B23K 26/20*** | (2014.01) |
| ***B23K 26/70*** | (2014.01) |
| ***B23K 37/04*** | (2006.01) |
| ***B23Q 3/08*** | (2006.01) |
| *B23K 101/42* | (2006.01) |
| *H10W 72/00* | (2026.01) |

(52) U.S. Cl.

CPC .......... *B23K 26/1462* (2015.10); *B23K 26/20* (2013.01); *B23K 26/702* (2015.10); *B23Q 3/088* (2013.01); *B23K 2101/42* (2018.08); *H10W 72/07141* (2026.01); *H10W 72/07178* (2026.01); *H10W 72/07235* (2026.01)

(58) Field of Classification Search

CPC ........... B23K 2101/36–42; B23K 37/04–0461; B23K 1/0016; B23K 1/005–0056; B23Q 3/088; H10W 72/07141; H10W 72/07178; H10W 72/07235; H10W 72/20; H10W 72/072; H10W 72/0711; H10W 72/07173; H10W 72/07236

USPC ...................... 228/44.7, 49.5, 179.1–180.22; 219/121.6–121.66

See application file for complete search history.

(56) References Cited

U.S. PATENT DOCUMENTS 9,162,320 B2 10/2015 Tanaka et al. ........... B23K 1/00
9,446,477 B2 9/2016 Tanaka et al. ......... B23K 26/00
10,286,470 B2 * 5/2019 Azdasht ................... B23K 3/04
11,508,690 B2 11/2022 Park et al. .............. H01L 23/00
11,973,054 B2 4/2024 Huang et al. ........ B23K 1/0056
2003/0098295 A1 5/2003 Kawamoto et al. . B23K 26/067 219/121.75
2003/0160084 A1 8/2003 Higashiyama ........... B23K 1/06 228/1.1
2006/0219760 A1 * 10/2006 Wagoh ................. H05K 3/3478 228/248.1
2007/0228021 A1 * 10/2007 Wagou ................. B23K 1/0056 219/121.63
2008/0179298 A1 * 7/2008 Nakayama ........... B23K 1/0056 219/85.21
2008/0202677 A1 8/2008 Ok .......................... H01L 21/02 156/272.8
2009/0314753 A1 12/2009 Kosmowski ........... B23K 26/16 219/121.72
2011/0309057 A1 12/2011 Lin ........................ B23K 26/00 219/121.63
2013/0112650 A1 5/2013 Karam et al. ...... B23K 26/0622 216/13
2014/0352141 A1 12/2014 Yasuyoshi ................ H05K 3/30
2017/0330856 A1 11/2017 Zou et al. ............... H01L 23/00
2018/0366433 A1 12/2018 Ahn ........................ H01L 23/00
2021/0398936 A1 12/2021 Park et al. ......... B23K 26/0622
2022/0126398 A1 4/2022 Fettke et al. ........... B23K 26/12
2022/0367404 A1 * 11/2022 Kitagawa ............. B23K 1/0016
2022/0406642 A1 12/2022 Huang et al. ......... H01L 21/683
2023/0088061 A1 3/2023 Park et al. ......... B23K 26/0604 219/121.76
2023/0105144 A1 * 4/2023 Fettke .................. B23K 1/0056
2023/0105729 A1 * 4/2023 Kolbasow ............. B23K 31/12 228/14
2024/0359272 A1 * 10/2024 Fettke .................. B23K 26/702

FOREIGN PATENT DOCUMENTS

CN 101295658 B 11/2010
CN 104379297 A * 2/2015 ........... B23K 26/127
CN 103367181 B 2/2016
CN 113385816 A * 9/2021 ............. B23K 26/21
CN 114501978 A 5/2022
CN 118951296 A * 11/2024 ......... B23K 26/1462
DE 102021113163 A1 * 11/2022 ............. B23K 26/20
EP 2045034 A1 4/2009
JP 2000-294602 A 10/2000
JP 2003-258037 A 9/2003
JP 2003-318230 A 11/2003
JP 2006103324 A * 4/2006 ............. B23K 26/40
JP 2014-236087 A 12/2014
JP 2015-72236 A 4/2015
JP 2019-009441 A 1/2019
JP 2021100074 A * 7/2021 .......... H10P 72/0448
JP 2022-069419 A2 5/2022
KR 10-2011-0038627 4/2011
KR 10-2014-0141430 12/2014
KR 10-2021-0020286 2/2021
TW I297188 B * 5/2008 ........ H10W 72/0711
TW I554354 B 10/2016
TW I680558 B 12/2019
TW I734619 B 7/2021
TW 202301487 A 1/2023
WO WO-2021059456 A1 * 4/2021 ............. H05K 3/328

OTHER PUBLICATIONS

Office action of the Korean Patent Office in the related Korean patent application KR10-2023-0074041 dated Jun. 19, 2024, as well as an English translation of the Korean Office action (27 pages).
Notice of allowance of the Japanese Patent Office in the related Japanese patent application JP2023-080943 dated Sep. 29, 2024, as well as the English machine translation of the Japanese notice of allowance (6 pages).
Office action and search report dated Oct. 7, 2024 of the Taiwanese Patent Office in the related Taiwanese patent application TW113105568, as well as an English translation of the Taiwanese Office action and search report (29 pages).
Office action and search report dated Dec. 9, 2024 of the Taiwanese Patent Office in the related Taiwanese patent application TW113105568, as well as an English translation of the Taiwanese Office action and search report (29 pages).
Office action of the Korean Patent Office in the related Korean patent application KR10-2023-0074041 dated Feb. 5, 2025, with no new items of prior art cited. (4 pages).
English translation of the Office action dated Feb. 5, 2025 of the Korean Patent Office in the related Korean patent application KR10-2023-0074041. (7 pages).

* cited by examiner

BONDING HEAD AND BONDING APPARATUS

CROSS REFERENCE TO RELATED APPLICATION

This application is a continuation of, and claims priority under 35 U.S.C. § 120 from, nonprovisional U.S. patent application Ser. No. 18/202,881 entitled "Bonding Head and Bonding Apparatus," now U.S. Pat. No. 12,358,084 B2, filed on May 26, 2023. Application Ser. No. 18/202,881, in turn, is a continuation-in-part of, and claims priority under 35 U.S.C. § 119 from German Patent Application No. DE 102023110696.1, filed on Apr. 26, 2023, in the German Patent Office. The subject matter of each of the foregoing documents is incorporated herein by reference.

TECHNICAL FIELD

The present disclosure relates to a bonding head and a bonding apparatus.

BACKGROUND

In this respect, U.S. Pat. No. 9,162,320 B2 discloses a bonding device that comprises a bonding tool arranged on a semiconductor chip to be bonded to a substrate by melting bumps arranged between contact areas of the chip and the substrate. For this reason, the bonding tool is irradiated with a laser beam and is configured to absorb the laser energy in order to be heated. The bonding tool in turn heats the chip such that the bumps are melted in order to bond the chip and the substrate after curing.

A similar technique is also known from JP 2003-258037 A.

US 2008/0202677 A1 discloses a chip bonding tool comprising a pressing block having a projection. A vacuum hole is formed in the pressing block and the projection such that a chip to be mounted on a substrate can be held and arranged by means of vacuum suction. The pressing block and the projection are made of laser-transmissive material so that a laser beam can pass therethrough in order to cure an adhesive agent applied to the substrate.

EP 2045034 A1 discloses a flip-chip mounting apparatus comprising a sucking head portion (also referred to as pushing body) having a sucking hole. In this way, a semiconductor chip can be held and arranged on a substrate by means of vacuum suction. The sucking head is made of transparent glass and allows a laser beam to pass therethrough in order to heat the chip and, thus, melt bumps arranged between contact areas of the chip and the substrate. However, this technique provides a drawback that the transparent glass may be contaminated, damaged or scratched such that the laser beam does not pass through the glass homogeneously. In addition, laser peaks having a higher power may be irradiated on the chip in the area of the sucking hole.

Therefore, it is an object of the present invention to overcome the drawbacks of the prior art and to provide an improved technique for a bonding head and a bonding apparatus.

SUMMARY

A bonding head holds a first substrate in a specific three-dimensional positional relationship to a second substrate and bonds the substrates together by melting bonding material deposited between contact areas on the substrates. The bonding material is melted by applying a laser beam to the first substrate. The bonding head includes a main body through which a laser duct extends from a laser entry to a laser exit. A vacuum source is configured to create a vacuum in the laser duct via a vacuum/pressure channel that leads through the main body to a vacuum/pressure port located inside the laser duct. A laser source is configured to emit and guide the laser beam through the laser duct to the laser exit. The bonding head also includes a holding nozzle exchangeably mounted to the main body. A nozzle duct extends from a nozzle entry arranged in communication with the laser exit to a nozzle exit disposed on the side of the holding nozzle that is opposite the main body such that the laser beam passes through the nozzle duct. The nozzle exit has a cross-section that is smaller than a holding face on the first substrate such that the first substrate is held by the holding nozzle when the vacuum source generates a suction in the laser duct.

A bonding head for holding a first substrate in a specific three-dimensional position relative to a second substrate and for bonding the substrates together by melting solder bodies disposed between the substrates by directing a laser beam onto the first substrate includes a laser source, a vacuum source, a main body and a holding nozzle. A laser duct extends through the main body from a laser entry to a laser exit. The vacuum source is configured to create a vacuum or suction in the laser duct. A vacuum/pressure channel extends through the main body from the vacuum source to the laser duct. The vacuum source creates the vacuum in the laser duct by generating a suction through the vacuum/pressure channel. The laser source directs the laser beam through the laser duct towards the laser exit. The holding nozzle is connected to the main body. A nozzle duct extends through the holding nozzle from a nozzle entry to a nozzle exit. The nozzle entry is adjacent to the laser exit. The holding nozzle is configured to hold the first substrate at the nozzle exit when the vacuum source creates the vacuum in the laser duct. The laser beam passes through the nozzle duct and is directed towards the first substrate. The holding nozzle is configured to hold the first substrate over a mounting face of a second substrate.

In one embodiment, the nozzle duct and the laser duct are aligned with one another. The holding nozzle is configured to hold the first substrate over the mounting face of the second substrate such that the laser duct and the nozzle duct extend at an oblique angle to the mounting face.

In another embodiment, the holding nozzle is configured to hold the first substrate over the mounting face of the second substrate such that the laser duct extends at a first oblique angle to the mounting face and such that the nozzle duct extends at a second and different oblique angle to the mounting face. Thus, the laser beam bends as it passes through the laser duct and the nozzle duct, which can be accomplished by configuring the nozzle duct to reflect the laser beam coming from the laser duct towards the nozzle exit.

In other embodiments, the bonding head also includes a temperature measuring unit, an optical fiber and an optical element. The optical fiber extends from the temperature measuring unit, through the main body, and into the laser duct. The holding nozzle is configured to hold the holding face of the first substrate. The optical fiber is directed through the nozzle exit at the holding face. The temperature measuring unit is configured to receive infrared radiation through the optical fiber to measure the temperature at the holding face. The laser source is configured to reduce the power of the laser beam when the temperature at the holding face measured by the temperature measuring unit exceeds a predetermined maximum allowable temperature The optical element is laser-transmissive, is disposed in the laser duct, and is oriented perpendicular to the laser duct. The optical element is configured to homogenize the power of the laser beam over a cross-section of the laser beam. The optical element fluidically divides the laser duct into a first laser duct part and a second laser duct part. The first laser duct part is located closer to the holding nozzle, and the second laser duct part is located farther away from the holding nozzle. A vacuum/pressure channel enters the laser duct at a vacuum/pressure port that is located in the first laser duct part. A fluid/pressure source is configured to introduce a pressurized fluid into the second laser duct part via a fluid/pressure channel that extends from the fluid/pressure source through the main body to the second laser duct part. The optical element is flexible such that a negative or positive pressure created by the fluid/pressure source in the second laser duct part compared to the first laser duct part causes the optical element to curve.

In yet another embodiment, a bonding head includes a main body, a laser source, an optical element, a holding nozzle, a vacuum source, and a fluid/pressure source. A laser duct extends from a laser entry, through the main body, and to a laser exit. The laser source directs a laser beam through the laser duct towards the laser exit. The optical element is disposed in the laser duct and is oriented perpendicular to the laser duct. The holding nozzle is connected to the main body. A nozzle duct extends through the holding nozzle from a nozzle entry to a nozzle exit. The nozzle entry is adjacent to the laser exit. The optical element divides the laser duct into a first laser duct part and a second laser duct part. The first laser duct part is located closer to the holding nozzle, and the second laser duct part is located farther away from the holding nozzle. The vacuum source is configured to create a vacuum in the nozzle duct. The holding nozzle is configured to hold a substrate at the nozzle exit when the vacuum source creates the vacuum in the nozzle duct. The laser beam passes through the nozzle duct and is directed towards the substrate. The fluid/pressure source is configured to introduce a pressurized fluid into the second laser duct part. The optical element is flexible such that a positive pressure created by the fluid/pressure source in the second laser duct part compared to the first laser duct part causes the optical element to curve.

A bonding apparatus includes a bonding head body, a laser source, a vacuum source, a holding nozzle, and a chuck. A laser duct extends through the bonding head body from a laser entry to a laser exit. The laser source directs a laser beam through the laser duct towards the laser exit. The vacuum source is configured to generate a suction in the laser duct. The holding nozzle is connected to the bonding head body. A nozzle duct extends through the holding nozzle from a nozzle entry to a nozzle exit. The laser duct is coupled to the nozzle duct. The nozzle entry is adjacent to the laser exit. The holding nozzle is configured to hold a first substrate at the nozzle exit when the vacuum source generates the suction in the laser duct. The laser beam passes through the nozzle duct and is directed towards the first substrate. The holding nozzle and the bonding head body are configured to be movable along a Z-axis perpendicular to an XY-plane. The chuck is configured to hold a second substrate and to be movable in the XY-plane. In one embodiment, the holding nozzle and the bonding head body are configured to be tiltable with respect to the Z-axis. The holding nozzle is configured to hold the first substrate in a specific three-dimensional positional relationship to the second substrate such that the laser beam can melt bonding material disposed between the first substrate and the second substrate.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, an example of which is illustrated in the accompanying drawing.

Figure 1:
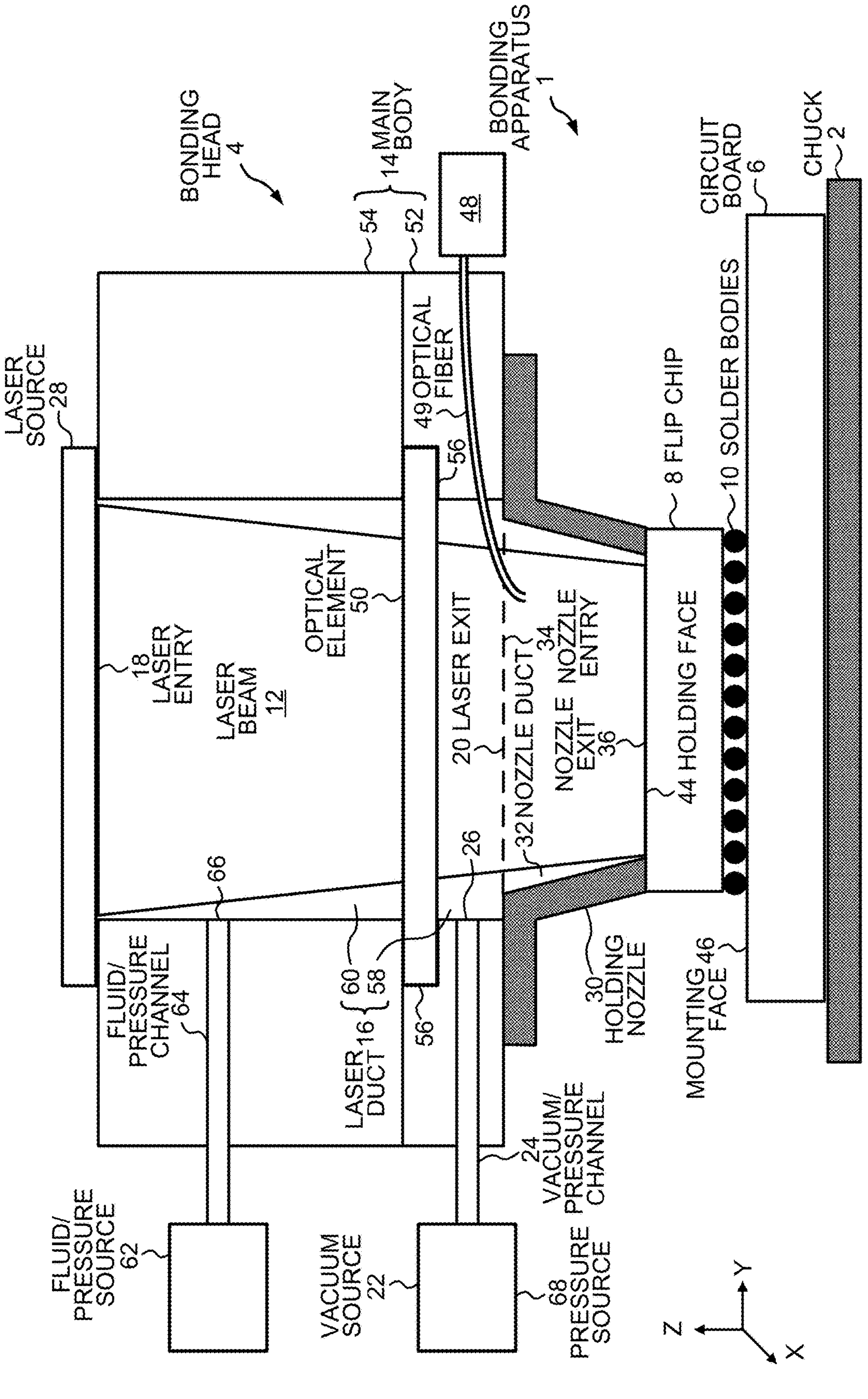
FIG. 1 schematically shows a bonding head according to a first embodiment of the present invention.

FIG. 1 shows a bonding head 4 for holding a first substrate 8 in a specific three-dimensional positional relationship with a second substrate 6 and bonding those substrates together by melting bonding material deposits 10, which are disposed between corresponding contact areas of the substrates, by applying a laser beam 12 to the first substrate 8. That is, the bonding material deposits, which may be solder bodies 10, such as solder bumps or solder balls, are indirectly heated by applying the laser beam 12 to the first substrate 8. The bonding material deposits may be arranged on metalized areas, such as an under bump metallization (UBM). Specifically, the first substrate may be a chip, for example a flip chip (FC) 8 or a vertical chip (VC) 72. The second substrate may be a circuit board 6, for example a printed circuit board (PCB) or a flexible printed circuit board (FPCB), or a chip stack.

The bonding head 4 includes a main body 14 having a laser duct 16 extending from a laser entry 18 to a laser exit 20. The main body 14 is composed of a rigid material and encompasses the laser duct 16.

The bonding head 4 further includes a vacuum source 22 configured to create a vacuum in the laser duct 16 via a vacuum/pressure channel 24 leading through the main body 14 to a vacuum/pressure port 26 arranged inside the laser duct 16. The vacuum/pressure channel 24 preferably extends perpendicularly to an extension direction of the laser duct 16 through the main body 14.

The bonding head 4 also includes a laser source 28 configured to emit and guide the laser beam 12 through the laser duct 16 to the laser exit 20. For example, the laser source 28 may be mounted at the laser entry 18. Alternatively, a fiber guiding the laser beam 12 may be arranged at the laser entry 18. In addition, the laser duct 16 may be bent, and the laser source 28 may include optics to guide the laser beam 12 through the laser duct 16.

Moreover, the bonding head 4 includes a holding nozzle 30 exchangeably mounted to the main body 14. For example, the holding nozzle 30 may have a flange that may be screwed to the main body 14. Further, a gasket may be arranged between the flange and the main body 14 in order ensure fluid tightness.

The holding nozzle 30 has a nozzle duct 32 extending from a nozzle entry 34 to a nozzle exit 36. The nozzle entry 34 is arranged in communication with the laser exit 20. That is, locations of the laser exit 20 and the nozzle entry 34 overlap each other. In particular, the nozzle entry 34 may have the same, a smaller or a larger area than the laser exit 20. Preferably, center points of the laser exit 20 and the nozzle exit 36 may be arranged in correspondence to each other. The nozzle exit 36 is arranged on a side opposite to the main body 14. Hence, the holding nozzle 30 corresponds to a tube-like member. Preferably, the holding nozzle 30 is made of an opaque and rigid material, such as metal or ceramic. Hence, the holding nozzle 30 is resistant and may be produced in a cost-efficient manner. Additionally, the holding nozzle 30 may have the same cross-sectional area along its entire length, widen, taper, or change a shape of its cross-section from the nozzle entry 34 to the nozzle exit 36. In this way, the laser beam 12 exiting the laser exit 20 passes the nozzle duct 32 and exits the nozzle exit 36. Most preferably, the laser source 28 is configured to emit the laser beam 12 over the whole cross-sectional area of the nozzle exit 36 with a homogenous power.

Furthermore, the nozzle exit 36 has a cross-section that is smaller than a holding face 44 on the first substrate. In this way, the first substrate is held at the nozzle exit 36 when the vacuum source 22 creates vacuum in the laser duct 16. As a consequence, wear of the glass of a sucking head and the inhomogeneous transmission of the laser beam 12 can be avoided. Moreover, by using the holding nozzle 30, chips having an uneven shape, for example a further chip, in the area of the holding face 44 may be bonded by using the bonding head 4. Because the holding nozzle 30 is exchangeably mounted to the main body 14, the bonding head 4 can be easily adapted to chips having a deviating size.

According to a preferred aspect of the present invention, the cross-section of the nozzle exit 36 can be adapted to a shape and/or a dimension of the holding face 44 on the first substrate. That is, the nozzle exit 36 may have the shape of the first substrate, for example a top face of the first substrate. In addition or alternatively, the dimension of the nozzle exit 36 may correspond to the dimension of the holding face 44 on the second substrate. For example, the nozzle exit 36 may be rectangular and may be dimensioned such that a rim of the holding nozzle 30 is arranged at edges of the holding face 44, for example a top face, of the first substrate. In this way, a vacuum force is applied homogenously to the first substrate and the first substrate may be evenly irradiated with the laser beam 12.

According to an aspect of the present invention, the nozzle exit 36 may be arranged so as to extend in parallel to a mounting face 46 on the second substrate. That is, a plane of the nozzle exit 36 is parallel to the mounting face on the second substrate. This orientation of the nozzle exit 36 and the mounting face corresponds to the specific three-dimensional positional relationship. In this way, the first substrate can be a flip chip 8 (such as a flip-chip ball grid array) that may be mounted on the second substrate, for example a circuit board 6 or another chip, having corresponding contact areas.

According to an alternative aspect of the present invention, the nozzle exit 36 may be arranged so as to extend perpendicular to a mounting face 46 on the second substrate. That is, a plane of the nozzle exit 36 is perpendicular to the mounting face 46 on the second substrate. This orientation of the nozzle exit 36 and the mounting face 46 is another example of the specific three-dimensional positional relationship. In this way, a vertical chip as the first substrate may be arranged with its end face on a circuit board 6 as the second substrate.

According to an alternative aspect of the present invention, the laser duct 16 and the nozzle duct 32 may extend in an oblique angle with respect to the mounting face 46 on the second substrate. In this way, a vertical chip as the first substrate may be arranged on the second substrate without the risk of the second substrate being damaged by the bonding head 4. Moreover, it is possible to mount a chip as the first substrate to a chip stack as the second substrate. In this respect, the end faces of the single chips of the chip stack in total form the mounting face of the chip stack. It is also possible to mount a vertical chip as the first substrate with its end face to a circuit board 6 as the second substrate.

According to an additional aspect of the present invention, the laser duct 16 may extend at an oblique angle with respect to the mounting face 46 on the second substrate and the nozzle duct 32 and, thus, the holding nozzle 30 may be curved or bent with respect to the mounting face 46 on the second substrate. For example, the holding nozzle 30 may be bent or curved towards the mounting face 46 or away from the mounting face. In this way, a vertical chip as the first substrate may be arranged on the second substrate while reducing the risk of the second substrate being damaged by the bonding head 4. In addition, the holding nozzle 30 may be shorter and may have a larger nozzle exit 36 compared to a case where the laser duct 16 and the nozzle duct 32 are arranged at an oblique angle. Again, it is possible to mount a chip as the first substrate to a chip stack as the second substrate. It is also possible to mount a vertical chip as the first substrate with its end face to a circuit board 6 as the second substrate.

According to an aspect of the present invention, the nozzle duct 32 may be configured to reflect the laser beam 12 towards the nozzle exit 36. The holding nozzle 30 may be made of reflective material, or the nozzle duct 32 may comprise a reflective coating. Hence, a larger area of the nozzle exit 36 may be used to apply the laser beam 12 to the first substrate. In particular, the reflection of the laser beam 12 is beneficial for a case where the laser duct 16 is arranged at an oblique angle, and the nozzle duct 32 is bent or curved with respect to the mounting face 46 on the second substrate.

According to an aspect of the present invention, the bonding head 4 may further include a temperature measuring unit 48 having an optical fiber 49 that extends through the main body 14 into the laser duct 16 and is directed towards the nozzle exit 36 in order to receive a temperature radiation (infrared radiation) from the holding face 44, and configured to measure a temperature of the first substrate based on the temperature radiation. In this way, the temperature on the holding face 44 of the first substrate may be taken into account during the process of bonding the first substrate to the second substrate.

According to an additional aspect of the present invention, the laser source 28 is configured to control the emission of the laser beam 12 in case the temperature measured by the temperature measuring unit 48 exceeds a predetermined maximum allowable temperature. In particular, during control of the laser beam 12, the power of the laser beam 12 may be reduced. Alternatively, the emission of the laser beam 12 can be stopped, or the laser beam can be emitted intermittently. That is, the laser beam 12 is emitted again when the measured temperature falls below the maximum allowable temperature. The emission of the laser beam 12 is again stopped in case the measured temperature exceeds the maximum allowable temperature again. As a result, by controlling the laser beam 12, damage to the first substrate due to overheating can be avoided.

According to a further aspect of the present invention, an optical element 50 transparent to the laser beam 12 and extending perpendicularly to the laser duct 16 can be arranged in the laser duct 16. The optical element 50 can be an optical window, a lens, a beam shaper or a beam homogenizer. The optical element 50 can also be a combination of these elements. Hence, optical properties of the laser beam 12 can be influenced in the laser duct 16 by using the optical element 50.

According to a preferred aspect of the present invention, the optical element 50 may be configured to homogenize the power of the laser beam 12 over its cross-section. Hence, the optical element 50 may correspond to a beam homogenizer. As a consequence, the first substrate is evenly irradiated with laser power such that an uneven heat distribution on the first substrate can be avoided.

According to an additional aspect of the present invention, the optical element 50 may be configured to shape the cross-section of the laser beam 12 according to a cross-section of the nozzle exit 36. Hence, the optical element 50 may correspond to a beam shaper. As a result, the first substrate may be evenly irradiated with laser power.

According to a beneficial aspect of the present invention, the optical element 50 may fluidically divide the laser duct 16 into a first laser duct part 58 closer to the holding nozzle 30 and a second laser duct part 60 farther away from the holding nozzle 30. For example, the optical element 50 may be sealed with a gasket against the main body 14 forming the laser duct 16. The gasket may be also formed by adhesive used to adhere the optical element 50 into the laser duct.

According to a preferred aspect of the present invention, the vacuum/pressure port 26 may be arranged in the first laser duct part 58. Hence, only a limited space needs to be evacuated, and a vacuum can be efficiently created in the first laser duct part 58.

According to a preferred aspect of the present invention, an end of the optical fiber 49 may extend into the first laser duct part 58. Hence, the optical fiber 49 receives the infrared radiation emitted from the holding face 44 of the first substrate without the infrared radiation passing through the optical element 50. The infrared radiation is indicative of the temperature at the holding face 44. Since the bonding head 4 uses the holding nozzle 30, the infrared radiation also does not have to pass a sucking head body made of glass. Therefore, the temperature of the first substrate can be detected with a higher accuracy because the infrared radiation is not affected by the optical element 50 or the sucking head body.

According to an optional aspect of the present invention, the bonding head 4 can include a fluid/pressure source 62 configured to introduce fluid or pressure into the second laser duct part 60 via a fluid/pressure channel 64 leading through the main body 14 to a fluid/pressure port arranged inside the second laser duct part 60. It is to be noted that the fluid is to be understood as a gas or a liquid. The introduction of the fluid is possible in a case where the laser duct 16 is fluidically divided by the optical element 50. In particular, the fluid may be cooling fluid or fluid influencing optical properties of the laser beam 12. Hence, the bonding head 4 may be cooled during operation. In this respect, it is to be noted that the fluid/pressure channel 64 and the fluid/pressure port may be formed by two separate channels and ports to allow the inflow and the outflow of the cooling fluid, respectively. Further, the optical properties of the laser beam 12 may be influenced without the need to replace the optical element 50. Alternatively, the fluid/pressure source 62 may introduce pressure gas into the second laser duct part 60 via the fluid/pressure channel 64 and the fluid/pressure port. It is to be noted that the fluid/pressure source 62 is also able to depressurize the second laser duct part 60. In particular, the pressure in the second laser duct may be lower or higher than the pressure in the first laser duct.

According to another aspect of the present invention, the optical element 50 can be configured so as to be flexible such that a curvature, in particular a convexity or concavity, of the optical element 50 may be adjusted by the fluid/pressure source 62 creating negative or positive pressure in the second laser duct part 60 with respect to the pressure in the first laser duct part 58. In particular, the center point of the optical element 50 can be shifted in the extension direction of the laser duct 16. As a result, the focus of the laser beam 12 and, thus, the area on the first substrate that is irradiated by the laser beam 12 can be set without the need to substitute the optical element 50.

According to a further aspect of the present invention, the bonding head 4 can include a vacuum/pressure source 22 configured to introduce pressure gas into the laser duct 16 via the vacuum/pressure channel 24 when the first substrate is held in the specific three-dimensional positional relationship with the second substrate, and the laser beam 12 is applied to the first substrate. The pressure source 22 may also be connected to the vacuum/pressure channel 24 so that no additional channel is required in the main body 14. The pressure source 22 and the vacuum source 22 may be formed by the same unit, which is switchable between vacuum mode and pressure mode. Alternatively, the pressure source and the vacuum source may be provided as separate units, which are connected to the vacuum/pressure channel 24 by means of a switchable valve. In particular, the pressure gas may be introduced into the laser duct 16 or the first laser duct part 58 when the first substrate and the second substrate are arranged in the specific positional relationship. Then, the first substrate may be bonded to the second substrate by applying the laser beam 12 to the first substrate in order to melt the bonding material deposits arranged between the first substrate and the second substrate. During the bonding process, i.e., during the application of the laser beam 12 to the first substrate, the pressure gas is supplied to the laser duct 16 or the first laser duct part 58. In this way, the first substrate is pressed against the mounding face of the second substrate when the bonding material deposits are melted. Therefore, a proper joint between the first substrate and the second substrate can be achieved after the bonding material deposits are cured again.

According to another aspect of the present invention, the main body 14 can be composed of a lower main body part 52 and an upper main body part 54. The optical element 50 is then arranged between the lower main body part 52 and the upper body part 54. In particular, the optical element 50 may be adhered between the lower main body part 52 and the upper main body part 54. Hence, the optical element 50 may be easily arranged or mounted in the laser duct 16. In addition, a gasket may be arranged between the optical element 50 and the main body 14 parts to achieve the above-described fluidic separation. The gasket may also be formed by the adhesive only.

According to a preferred aspect of the present invention, at least one of the lower main body part 52 or the upper main body part 54 may form a groove portion in which the optical element 50 is arranged. That is, either one of the lower main body part 52 or the upper main body part 54 may form the groove portion. Alternatively, the lower main body part 52 and the upper main body part 54 combined may form the groove portion. Edges of the optical element 50 are then arranged in the groove portion in order to hold the optical element 50. The groove portion may extend along the whole inner circumference of the laser duct 16 such that the above-mentioned fluidic separation of the laser duct 16 can be achieved. The optical element 50 may be adhered to the groove portion. A gasket may also be arranged in the groove portion. In order to arrange the optical element 50 in the groove portion, the lower main body part 52 and the upper main body part 54 can be separate parts that are fixed together for example by using screws.

According to an alternative aspect of the present invention, the laser duct 16 can be formed narrower in the lower main body part 52 so as to form, between the lower main body part and the upper main body part, a stepped portion on which the optical element 50 is arranged. In particular, the optical element 50 may be adhered to the stepped portion. Preferably, the stepped portion may extend along the whole inner circumference of the laser duct 16 such that the above-mentioned fluidic separation can be achieved. Furthermore, a gasket can be arranged on the stepped portion. In this respect, the main body parts may be formed integrally or separately. Either way, the optical element 50 can easily be arranged on the stepped portion and, thus, in the laser duct 16.

The present invention further provides a bonding apparatus 1 that includes a chuck 2 configured to hold the second substrate and to be movable in an XY-plane. Moreover, the bonding apparatus 1 includes the bonding head 4 according to any one of the aforementioned aspects. The bonding head 4 is configured to be movable in a Z-direction, perpendicular to the XY-plane. For example, the bonding head 4 can be moved by using an axis system. In this way, the first substrate held by the bonding head 4 in the specific three-dimensional relationship can be arranged on the second substrate by means of a three-dimensional relative movement of the chuck 2 and the bonding head 4. Afterwards, the substrates can be bonded together by applying the laser beam 12 to the first substrate.

According to an aspect of the present invention, the bonding apparatus 1 can include a first substrate carrier configured to store at least one first substrate and to be movable in the XY-plane or a plane parallel to the XY-plane. Preferably, the at least one substrate is arranged on the first substrate carrier in the way that it is to be mounted on the second substrate. The chuck 2 and the first substrate carrier can be interconnected and, thus, can be moved in the same XY-plane. At first, the first substrate carrier is moved under the bonding head 4 such that the bonding head 4 can grasp and hold one of the first substrates stored on the first substrate carrier. Then, the chuck may be moved under the bonding head 4 in order to arrange the second substrate, i.e., a mounting face 46 of the second substrate, in relation to the first substrate. The bonding head 4 holding the first substrate moves down in order to arrange the first substrate on the second substrate and to bond the two substrates together by applying the laser beam 12 to the first substrate. Alternatively, one of the elements first substrate carrier or chuck 2 may be moveable over the other one. For example, the first substrate carrier may be moved over the chuck 2. Then, the bonding head 4 can grasp and hold one of the first substrates. Afterwards, the first substrate carrier is moved away, and the bonding head 4 is moved down to arrange the first substrate on the second substrate and to bond the substrates together.

According to an additional aspect of the present invention, the bonding head 4 can be configured to be tiltable with respect to the Z-direction. For example, the bonding head 4 can be mounted to the axis system by means of a controllable ball joint or a hexapod. In this way, an oblique or tilted arrangement of the second substrate in the chuck 2 can be compensated such that the first substrate is appropriately arranged on the second substrate.

First Embodiment

FIG. 1 shows a bonding apparatus 1 according to the first embodiment. The bonding apparatus 1 comprises a chuck 2 and a bonding head 4 according to a first embodiment. The chuck 2 is configured to hold a circuit board 6 corresponding to a second substrate and is movable in a XY-plane. The bonding head 4 is configured to hold a flip chip 8 corresponding to a first substrate and is movable in a Z-direction perpendicular to the XY-plane. That is, the circuit board 6 and the flip chip 8 can be arranged relative to each other by moving the chuck 2 and the bonding head 4. The chuck 2 can be mounted on a shiftable stage, and the bonding head 4 can be moved by means of an axis system. Because the circuit board 6 can be arranged on the chuck 2 in a tilted or oblique manner, the bonding head 4 is preferably tiltable with respect to the Z-direction. In particular, the bonding head 4 can be mounted to the axis system by using a controllable ball joint or a hexapod.

Although not shown in the drawings, the bonding apparatus 1 can also include a flip chip carrier as a first substrate carrier that is configured to store at least one flip chip 8. Preferably, the flip chip 8 is arranged on the flip chip carrier in a way as it is to be mounted on the circuit board 6. The flip chip carrier can be movable in the XY-plane or a plane parallel to the XY-plane. The chuck 2 and the flip chip carrier can be interconnected and, thus, can be moved in the same XY-plane. At first, the flip chip carrier is moved under the bonding head 4 such that the bonding head 4 can grasp and hold one of the flip chip 8 stored on the flip chip carrier. In order to grasp the flip chip 8, the bonding head 4 moves down, holds the flip chip 8 and then moves up again. Then, the chuck 2 can be moved under the bonding head 4 in order to arrange the circuit board 6 in relation to the flip chip 8. The bonding head 4 holding the flip chip 8 moves down again in order to arrange the flip chip 8 on the circuit board 6 and to bond the two substrates 6, 8 together.

Alternatively, one of the elements flip chip carrier or chuck 2 can be moveable over the other one. For example, the flip chip carrier is moved over the chuck 2. Then the bonding head 4 grasps and holds a flip chip 8. Afterwards, the flip chip carrier is moved away, and the bonding head 4 is moved down to arrange the flip chip 8 on the circuit board 6 and to bond the substrates 6, 8 together.

The bonding head 4 is designed for holding the flip chip 8 as the first substrate in a specific three-dimensional positional relationship with the circuit board 6 as the second substrate, and for bonding these substrates 6, 8 together by melting bonding material deposits, which are disposed between contact areas of the circuit board 6 and the flip chip 8. In particular, the bonding material deposits are solder bodies 10 (also referred to as solder bumps) in the present embodiment, and the solder bodies 10, which can be round or cuboid, are melted by applying the laser beam 12 to the flip chip 8. In this way, the flip chip 8 is heated and, the solder bodies 10 disposed underneath the flip chip 8 are in turn heated and melted. After the liquefied solder bodies 10 solidify again, a permanent electrical and mechanical joint between the flip chip 8 and the circuit board 6 is achieved.

In order to perform the above described process, the bonding head 4 includes a main body 14 having a laser duct 16 that extends from a laser entry 18 to a laser exit 20. In addition, the bonding head 4 includes a vacuum source 22 configured to create a vacuum in the laser duct 16 via a vacuum/pressure channel 24 leading through the main body 14 to a vacuum/pressure port 26 located inside the laser duct 16. The bonding apparatus 1 also includes a laser source 28 configured to emit and to guide the laser beam 12 through the laser duct 16 to the laser exit 20. In FIG. 1, the laser source 28 directly couples the laser beam 12 into the laser entry 18. Alternatively, the laser beam 12 can be introduced into the laser entry 18 by using a fiber that guides the laser beam 12. The laser source 28 can also include optics to form and guide the laser beam 12.

Moreover, the bonding head 4 also includes a holding nozzle 30 that is exchangeably mounted to the main body 14. The holding nozzle 30 has a nozzle duct 32 extending from a nozzle entry 34 to a nozzle exit 36. The nozzle entry 34 is arranged in communication with the laser exit 20 so that the laser beam 12 passing the laser duct 16 can enter the nozzle duct 32. The nozzle exit 36 is arranged on the side of the holding nozzle 30 opposite the main body 14 such that holding nozzle 30 corresponds to a tube-like member. Finally, the laser beam 12 exits the nozzle exit 36.

As shown in FIG. 1, the nozzle exit 36 has a cross-section that is smaller than a holding face 44 on the flip chip 8 such that flip chip 8 is held at a tip of the holding nozzle 30 when the vacuum source 22 creates suction or a vacuum in the laser duct 16. In other words, the flip chip 8 is held at the tip of the holding nozzle 30 by means of vacuum suction.

Preferably, the holding face 44 is provided as a flat or even area on the flip chip 8 such that a rim of the application nozzle 30 surrounding the nozzle exit 36 can be easily placed thereon. Nevertheless, there can be uneven shapes within an area inside the rim of the holding nozzle 30, i.e., in the area of the nozzle exit 36. In this respect, FIG. 2 shows an application example of the bonding head 4 according to the first embodiment.

Figure 2:
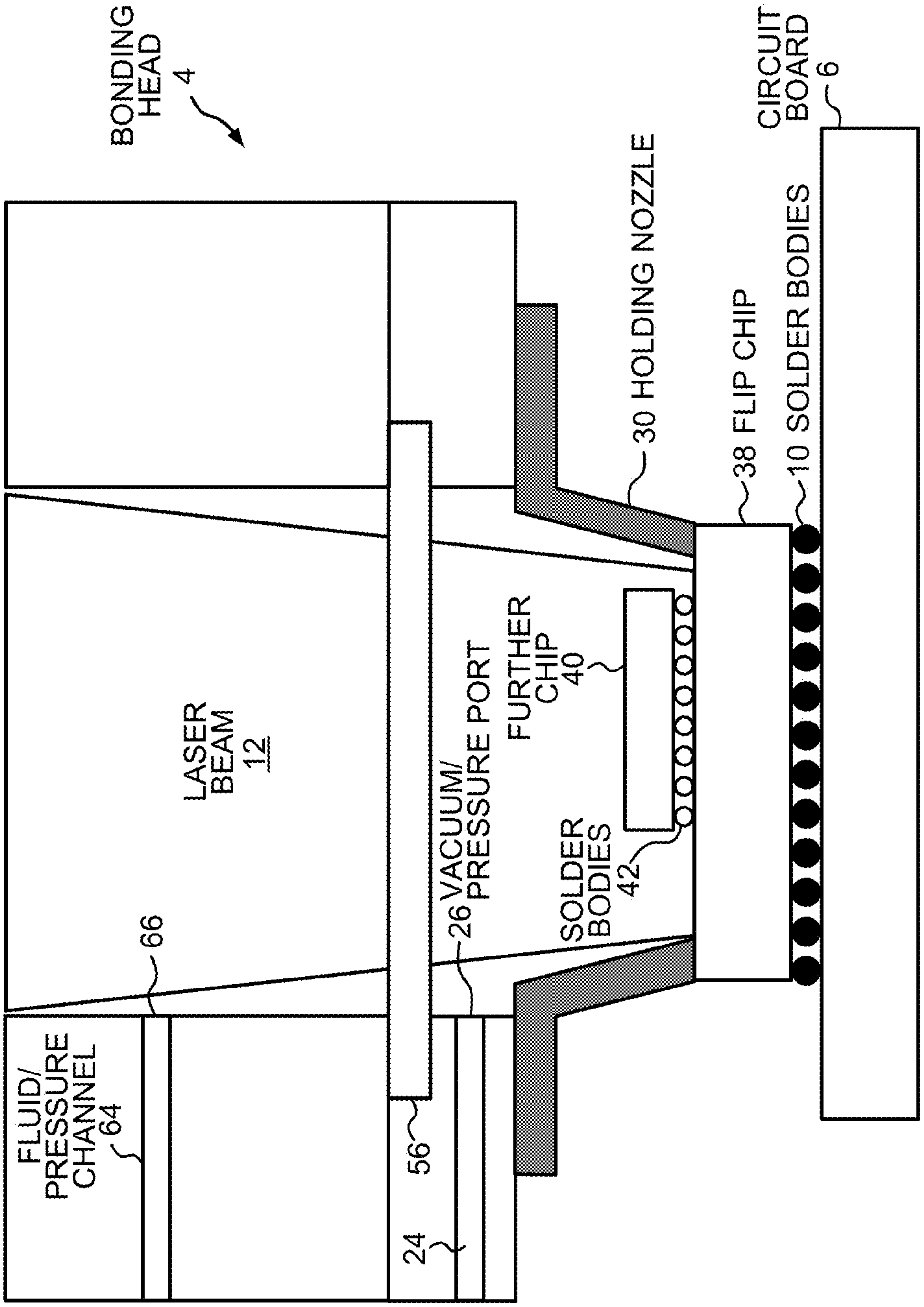
FIG. 2 schematically shows an application example of the bonding head according to the first embodiment.

FIG. 2 shows how a flip chip 38 carrying a further chip 40 is bonded to the circuit board 6. This is possible because a free space that accommodates the further chip 40 is provided inside the nozzle duct 32. It is to be noted that solder bodies 42 used for mounting the further chip 40 on the flip chip 38 can have a higher melting point than the solder bodies 10 in order to avoid demounting the further chip 40. Alternatively, the further chip 40 can be affixed to the flip chip 38 by using another bonding material, such as adhesive, instead of solder.

As shown in FIG. 1, it is beneficial for the cross-section of the nozzle exit 36 to be adapted to the shape and dimension of the holding face 44. That is, the rim of the holding nozzle 30 should correspond to edges of the top face of the flip chip 8. In this way, the tension on the flip chip 8 due to the vacuum suction is evenly distributed. Moreover, the laser beam 12 can be evenly irradiated on the flip chip 8 such that heat on the flip chip 8 is distributed evenly, and the solder bodies 10 are reliably melted over the entire area of the flip chip 8.

As shown in FIG. 1, the bonding head 4 according to the present embodiment is used to arrange and bond the flip chip 8 to the circuit board 6. In particular, the flip chip 8 is arranged on the circuit board 6 such that the surface that is normal to the holding face 44 and the surface that is normal to the mounting face 46 on the circuit board 6 are parallel to each other. In order to achieve this arrangement, the nozzle exit 36 is arranged so as to extend parallel to the mounting face 46 of the circuit board 6. This arrangement of the flip chip 8 and the circuit board 6 constitutes one example of the specific three-dimensional positional relationship.

The bonding head 4 can further include a temperature measuring unit 48 having an optical fiber 49 that extends through the main body 14 and into the laser duct 16. The optical fiber 49 is directed towards the nozzle exit 36 in order to receive the temperature radiation (infrared radiation) from the holding face 44. As shown in FIG. 1, the optical fiber 49 preferably extends straight through the main body 14 and is then bent towards the nozzle exit 36, i.e., towards the holding face 44. In particular, the optical fiber 49 is bent by using a rigid sheathing. The temperature measuring unit 48 receives the infrared radiation via the optical fiber 40 and measures the temperature of the flip chip 8 based on the infrared radiation.

Furthermore, the laser source 28 can be configured to control the emission of the laser beam 12 in case the temperature measured by the temperature measuring unit 48 exceeds a predetermined maximum allowable temperature. In particular, the power of the laser beam 12 can be controlled to decrease. Alternatively, the emission of the laser beam 12 can be stopped, or the laser beam 12 can be emitted intermittently. That is, the laser beam 12 is emitted again when the measured temperature falls below the maximum allowable temperature. In case the temperature exceeds the maximum allowable temperature again, the emission of the laser beam 12 is again stopped. As a result, damage to the flip chip 8 due to overheating is avoided.

Preferably, an optical element 50 that is transparent to the laser beam 12 is arranged in the laser duct 16. The optical element 50 in the present embodiment is an optical window and extends perpendicularly to the laser duct 16. Alternatively, the optical element 50 can be configured to homogenize the power of the laser beam 12 over its cross-section and/or to shape the cross-section of the laser beam 12 to conform to the cross-section of the nozzle exit 36. Hence, the flip chip 8 can be evenly irradiated with the laser beam 12.

In order to arrange the optical element 50 in the laser duct 16, the main body 14 can be composed of a lower main body part 52 and an upper main body part 54. The optical element 50 is then arranged between the lower main body part 52 and the upper body part 54. As shown in FIG. 1, a groove portion 56 is formed in the lower main body part 52 in order to hold the optical element 50. The groove portion 56 can be arranged around the entire circumference of the laser duct 16. The groove portion 56 can also be formed in the upper main body part 54, or in the lower main body part 54 and the upper main body part 56 together. In order to arrange the optical element 50 in the groove portion 56, the lower main body part 52 and the upper main body part 54 are formed as separate elements, which can be attached together for example by using screws.

Furthermore, the optical element 50 may fluidically divide the laser duct 16 into a first laser duct part 58 closer to the holding nozzle 30 and a second laser duct part 60 farther away from the holding nozzle 30. The vacuum/pressure port 26 is then arranged in the first laser duct part 58 in order to create a vacuum in the first laser duct part 58. Because the space in which the vacuum needs to be created is now limited to the first laser duct part 58, the vacuum source 22 need only evacuate a reduced amount of gas in order to hold the flip chip 8 by means of vacuum suction. Hence, the efficiency of the bonding head 4 as well as the processing speed is increased.

In addition, an end of the optical fiber 49 extends into the first laser duct part 52. Hence, the optical fiber 49 can receive the temperature radiation from the holding face 44 of the flip chip 8 without the temperature radiation passing through the optical element 50. Because the bonding head 4 uses the holding nozzle 30, the temperature radiation also does not have to pass through the sucking head body made of glass. Therefore, the temperature of the flip chip 8 can be detected with a higher accuracy because the temperature radiation is not influenced by passing through the optical element 50 or the sucking head body.

The fluidic separation of the laser duct 16 also provides the benefit that the bonding head 4 can include a fluid/pressure source 62. The fluid/pressure source 62 is configured to introduce fluid or pressure into the second laser duct part 60 via a fluid/pressure channel 64 that leads through the main body 14 to a fluid/pressure port 66 disposed in the second laser duct part 60. In particular, the fluid might be a cooling fluid or a fluid that influences optical properties of the laser beam 12. In this way, the bonding head 4 can be cooled during operation. In this respect, it is to be noted that the fluid/pressure channel 64 and the fluid/pressure port 66 can be formed by two separate channels and ports to allow the inflow and the outflow of the cooling fluid, respectively. Furthermore, the optical properties of the laser beam 12 can be influenced without the need to change the optical element 50.

Alternatively, the fluid/pressure source 62 is able to introduce pressure gas into the second laser duct part 60 via the fluid/pressure channel 64 and the fluid/pressure port 66. In this regard, the fluid/pressure source 62 is also able to depressurize the second laser duct part 60. In particular, the pressure in the second laser duct 60 can be lower or higher than a pressure in the first laser duct 58.

Preferably, the optical element 50 can be flexible such that a curvature, i.e., a convexity or concavity, of the optical element 50 can be adjusted by the fluid/pressure source 62 creating negative or positive pressure in the second laser duct part 60 with respect to a pressure in the first laser duct part 58. In particular, as the optical element 50 is held with its whole circumference, a center point of the optical element 50 is shifted in the extension direction of the laser duct 16. As a result, the focus of the laser beam 12 and, thus, an area on the flip chip 8, which is irradiated by the laser beam 12, can be adjusted without the need to substitute the optical element 50.

The bonding head 4 according to the present embodiment may also include a pressure source 68. The pressure source 68 is configured to introduce pressure gas into the laser duct 16 via the vacuum/pressure channel 24 when the flip chip 8 is arranged on the circuit board 6 and the laser beam 12 is applied to the flip chip 8. Hence, the solder bodies 10 between the flip chip 8 and the circuit board 6 are melted, and the flip chip 8 is pressed against the circuit board 6. As a result, a suitable mechanical and electrical joint between the flip chip 8 and the circuit board 6 is achieved after the liquefied solder bodies 10 are again cured. In the embodiment shown in FIG. 1, the vacuum source 22 and the pressure source 68 are integrally formed as a single unit, which is able to switch between the pressure mode and the vacuum mode. Alternatively, the pressure source 68 and the vacuum source 22 can be formed as separate units.

In summary, the bonding apparatus 1 and the bond head 4 according to the first embodiment are configured so as to avoid the effects that wear on a sucking head made of glass. Therefore, an uneven laser irradiation of the first substrate can be avoided. Furthermore, a first substrate that has an uneven projection, such as a further chip, can be mounted to the second substrate.

Second Embodiment

Figure 3:
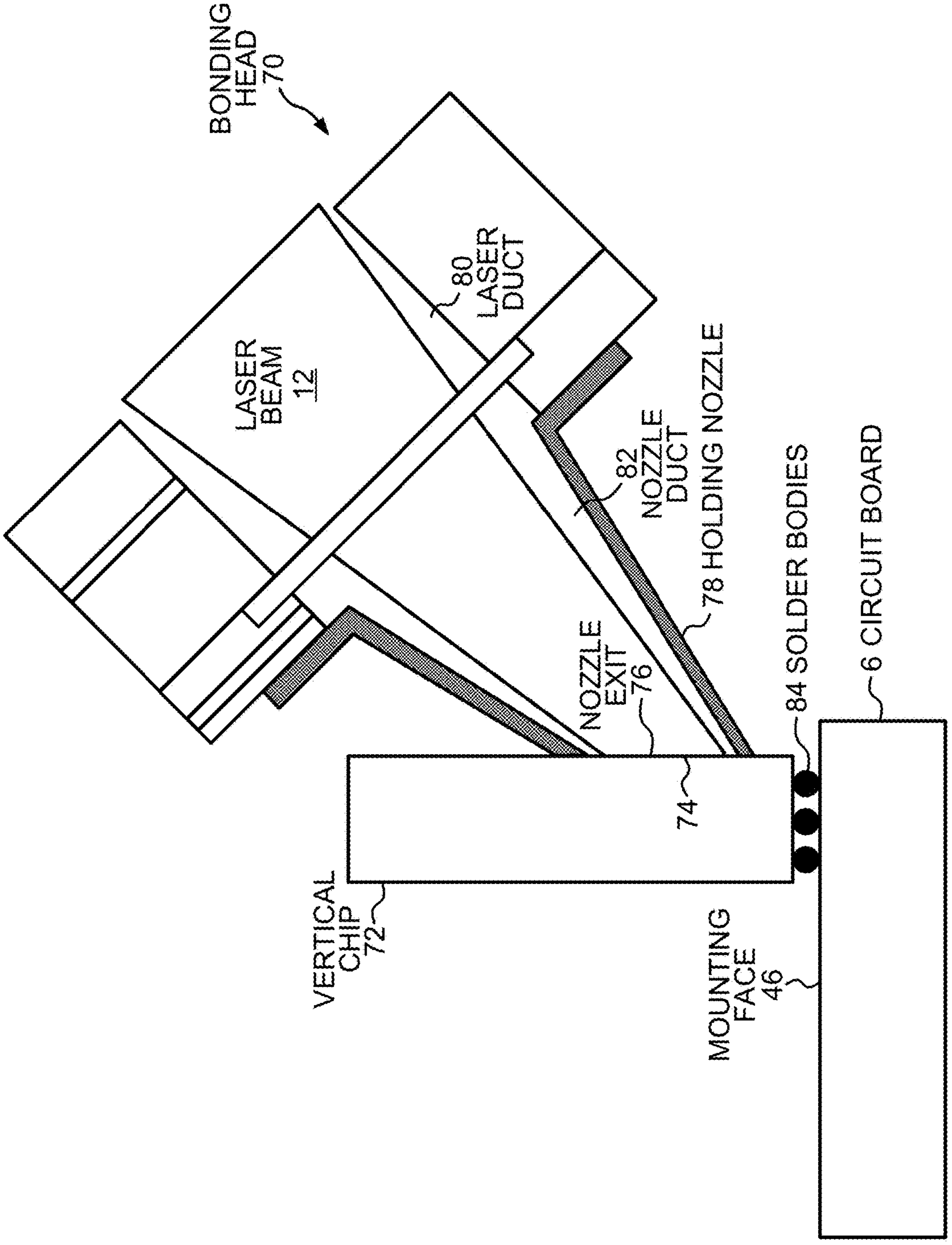
FIG. 3 schematically shows a bonding head according to a second embodiment of the present invention.

FIG. 3 shows a bonding head 70 according to a second embodiment of the present invention. The bonding head 70 is similar to the bonding head 4 of the first embodiment and, thus, only the differences are described below.

The first substrate in the present embodiment is a vertical chip 72, which is to be bonded with one of its end faces to the mounting face 46 of the circuit board 6. In this respect, the term "vertical" is intended to describe the orientation of extension direction of the chip 72 with respect to the horizontal orientation of the circuit board 6. Hence, the surface normal of a holding face 74 of the vertical chip 72 and the surface normal of the mounting face 46 of the circuit board 6 are perpendicular to each other. For this reason, a nozzle exit 76 of a holding nozzle 78 is arranged so as to extend perpendicularly to the mounting face 46 on the circuit board 6.

In addition, a laser duct 80 and a nozzle duct 82 extend in an oblique angle with respect to the mounting face 46 on the circuit board 6. In the embodiment shown in FIG. 3, the laser duct 80 and the nozzle duct 82 are inclined by 45° with respect to the surface normal of the mounting face 46. However, the present embodiment is not limited to this angle. Preferably, the vertical chip 72 is held by the holding nozzle 78 in a position in proximity to the end face, which is to be bonded to the circuit board 6. Hence, only an area of the vertical chip 72 in proximity to the circuit board 6 needs to be heated in order to melt solder bodies 84 arranged between the vertical chip 72 and the circuit board 6.

As a result, the bonding head 70 according to the second embodiment provides the effect that it can arrange and bond a vertical chip 72 to the circuit board 6. Moreover, the oblique arrangement of the laser duct 80 and the nozzle duct 82 with respect to the surface normal of the mounting face 46 reliably prevents damage to the circuit board 6.

The example of FIG. 3 shows a case where the solder bodies 84 are arranged between the end face of the vertical chip 74 and the mounting face 46 of the circuit board 6. However, the second embodiment also includes a case where the end face of the vertical chip 74 is in close contact with the holding face 46, and the solder bodies are arranged in at least one corner formed between the larger faces of the vertical chip 74 and the holding face 46 of the circuit board 6.

Third Embodiment

Figure 4:
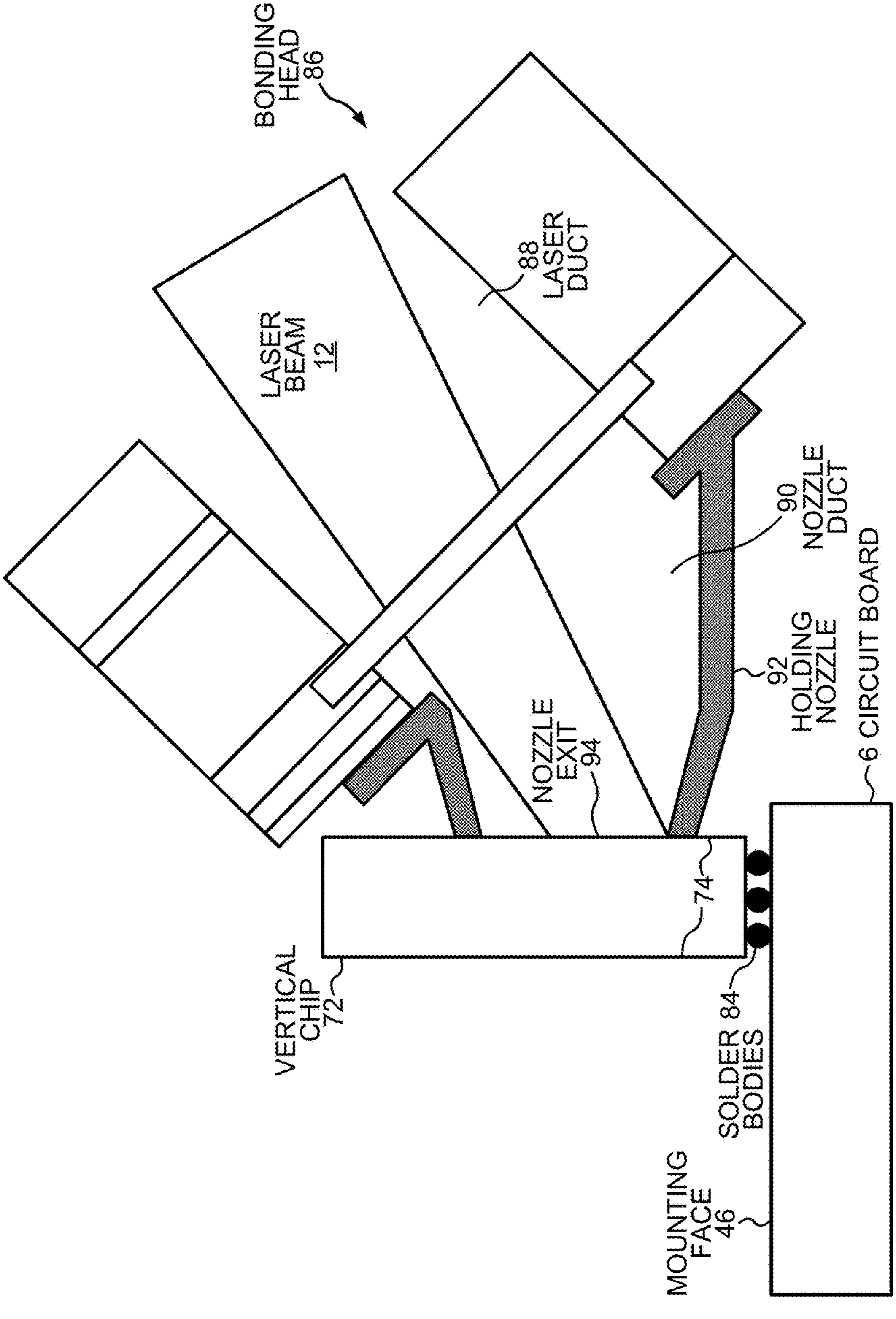
FIG. 4 schematically shows a bonding head according to a third embodiment of the present invention.

FIG. 4 shows a bonding head 86 according to a third embodiment of the present invention. The bonding head 86 is similar to the bonding head 70 of the second embodiment, and thus only the differences are described below.

As can be seen in FIG. 4, a laser duct 88 extends at an oblique angle with respect to the mounting face 46 on the circuit board 6. However, the nozzle duct 90 of the holding nozzle 92 is bent or curved away from the mounting face 46 on the circuit board 6. As a result, the holding nozzle 92 can be shorter and may have a larger nozzle exit 94 compared to the second embodiment.

Fourth Embodiment

Figure 5:
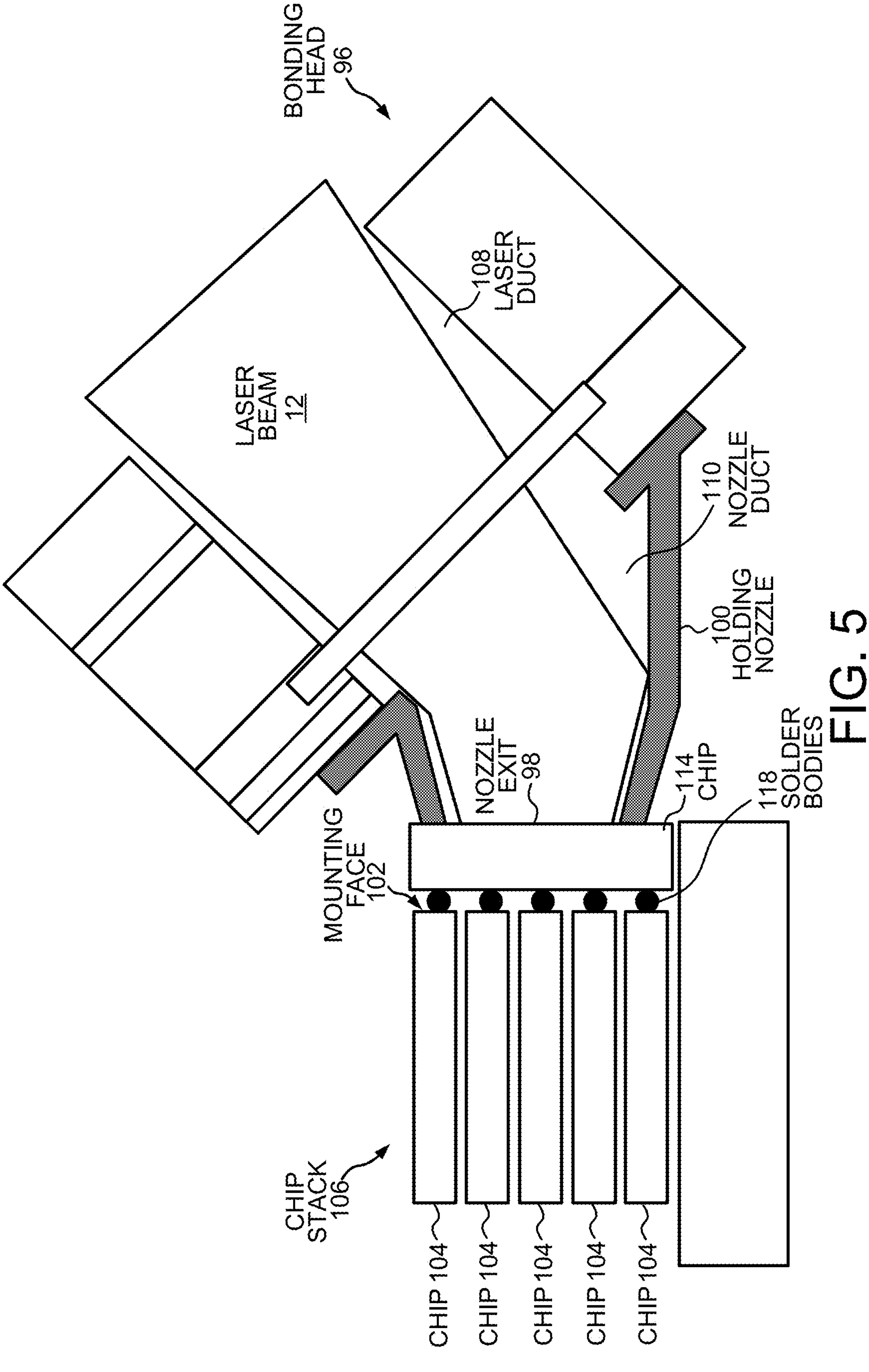
FIG. 5 schematically shows a bonding head according to a fourth embodiment of the present invention.

FIG. 5 shows a bonding head 96 according to a fourth embodiment of the present invention. The bonding head 96 is similar to the bonding head 86 of the third embodiment, and thus only the differences are described in the following.

As shown in FIG. 5, a nozzle exit 98 of a holding nozzle 100 is arranged so as to extend in parallel to a mounting face 102 formed by multiple end faces of chips 104 arranged in a chip stack 106. That is, the end faces together form the mounting face 102.

Again, a laser duct 108 extends in an oblique angle with respect to the mounting face 102. However, a nozzle duct 110 of the holding nozzle 100 is bent or curved towards the mounting face 102. As a result, a chip 114 can be mounted to the holding face 102, i.e., to the multiple end faces of the chips 104 arranged in the chip stack 106.

In addition, the nozzle duct 110 is configured to reflect the laser beam 12 towards the nozzle exit 98. In this way, the area on the chip 114 that is irradiated by the laser beam 12 can be enlarged. Hence, solder bodies 118 disposed between the chip 114 and the end faces of the multiple chips 104 are appropriately melted. The holding nozzle 100 can be made of reflective material, or the nozzle duct 110 can include a reflective coating in order to achieve the reflectance towards the nozzle exit 98. It is to be noted that the reflectance towards the nozzle exit can also be used in combination with the bonding head 86, i.e., the nozzle duct 90 of the third embodiment.

Fifth Embodiment

Figure 6:
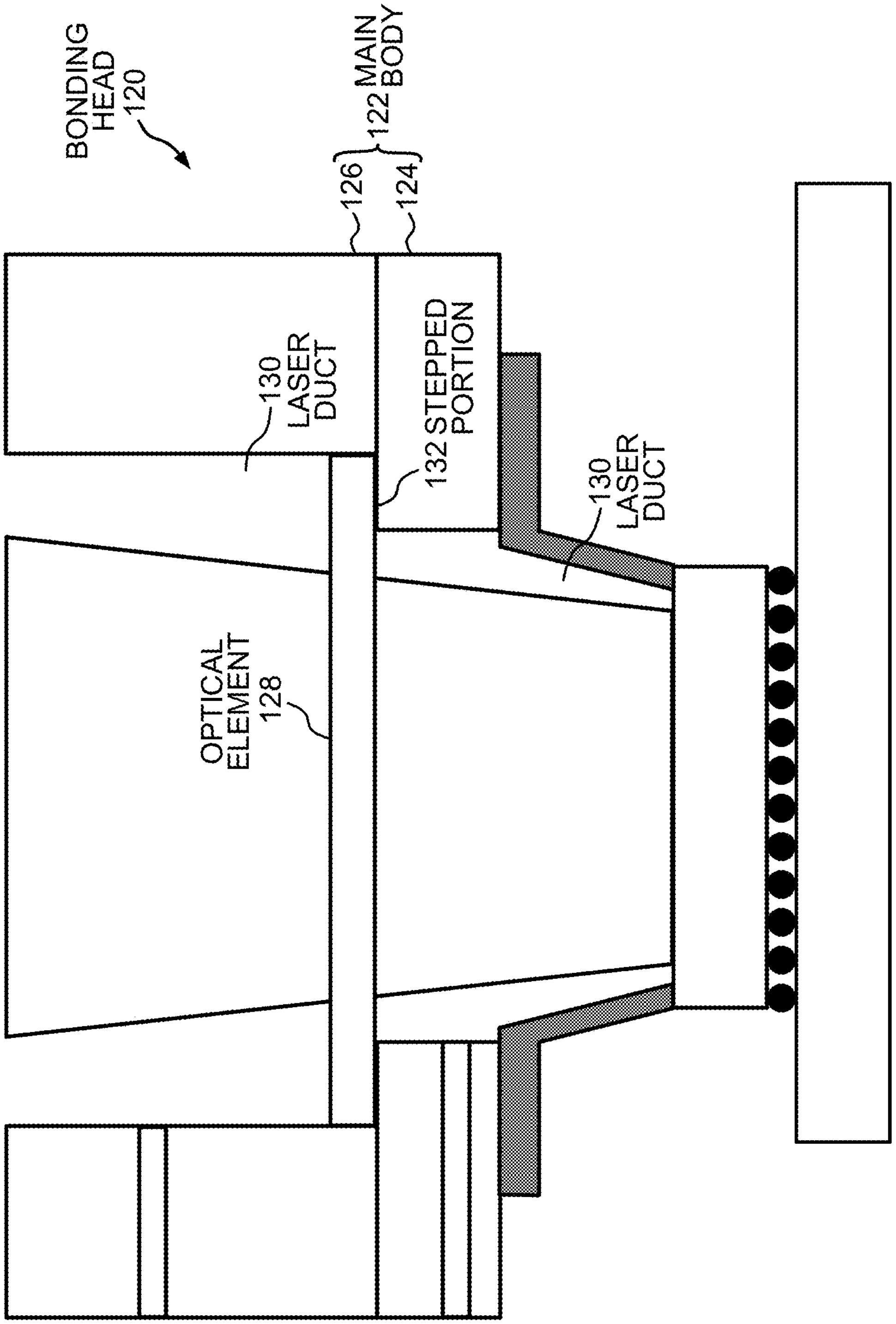
FIG. 6 schematically shows a bonding head according to a fifth embodiment of the present invention.

FIG. 6 shows a bonding head 120 according to a fifth embodiment of the present invention. The bonding head 120 is similar to the bonding head 4 according to the first embodiment, and thus only the differences are described in the following.

A main body 122 is composed of a lower main body part 124 and an upper main body part 126. Again an optical element 128 is disposed between the lower main body part 124 and the upper body part 126. However, the laser duct 130 is formed narrower in the lower main body part 124 so as to form, between the lower main body part 124 and the upper main body part 128, a stepped portion 132 on which the optical element 128 is arranged. Preferably, the optical element 128 is adhered to the stepped portion 132. As a result, it is not necessary for the lower main body part 124 and the upper main body part 126 to be formed by separate parts; they can be integrally formed. Therefore, the optical element 128 can easily be arranged inside the laser duct 130. It is to be noted that the stepped portion 132 according to the fifth embodiment can be used in the bonding heads of the second to fourth embodiment.

REFERENCE NUMERALS

1 bonding apparatus
2 chuck
4 bonding head
6 circuit board
8 flip chip
10 solder body
12 laser beam
14 main body
16 laser duct
18 laser entry
20 laser exit
22 vacuum source
24 vacuum/pressure channel
26 vacuum/pressure port
28 laser source
30 holding nozzle
32 nozzle duct
34 nozzle entry
36 nozzle exit
38 flip chip
40 further chip
42 solder body
44 holding face
46 mounting face
48 temperature measuring unit
49 optical fiber
50 optical element
52 lower main body part
54 upper main body part
56 groove portion
58 first laser duct part
60 second laser duct part
62 fluid/pressure source
64 fluid/pressure channel
66 fluid/pressure port
68 pressure source
70 bonding head
72 vertical chip
74 holding face
76 nozzle exit
78 holding nozzle
80 laser duct
82 nozzle duct
84 solder bodies
86 bonding head
88 laser duct
90 nozzle duct
92 holding nozzle
94 nozzle exit
96 bonding head
98 nozzle exit
100 holding nozzle
102 mounting face
104 chip
106 chip stack
108 laser duct
110 nozzle duct
114 chip
118 solder bodies
120 bonding head
122 main body
124 lower main body part
126 upper main body part
128 optical element
130 laser duct
132 stepped portion Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. A bonding head comprising:

a main body through which a laser duct extends from a laser entry to a laser exit;

a laser source that directs a laser beam through the laser duct towards the laser exit;

a holding nozzle connected to the main body, wherein a nozzle duct extends through the holding nozzle from a nozzle entry to a nozzle exit, wherein the nozzle entry is adjacent to the laser exit;

a vacuum source configured to create a vacuum in the nozzle duct, wherein a vacuum/pressure channel extends through the main body from the vacuum source to the laser duct, wherein the holding nozzle is configured to hold a substrate at the nozzle exit when the vacuum source creates the vacuum in the nozzle duct, and wherein the laser beam passes through the nozzle duct and is directed towards the substrate; and a pressure source configured to introduce a pressurized gas into the laser duct via the vacuum/pressure channel when the substrate is being held at the nozzle exit and the laser beam is being directed towards the substrate, wherein the holding nozzle is configured to hold the substrate over a mounting face of a second substrate such that when the pressurized gas is introduced into the laser duct, the substrate is pressed against the mounting face of the second substrate.

2. The bonding head of claim 1, wherein the holding nozzle is made of an opaque material that is not laser-transmissive.

3. The bonding head of claim 1, wherein the nozzle exit has a cross-section dimension, wherein the substrate has a holding face with a face dimension, and wherein the holding nozzle is adapted such that the cross-section dimension of the nozzle exit corresponds to the face dimension of the holding face.

4. The bonding head of claim 1, wherein the vacuum source and the pressure source are embodied in a single unit, and wherein the single unit can be controlled to switch between creating the vacuum and introducing the pressurized gas.

5. The bonding head of claim 1, further comprising:

an optical element disposed in the laser duct, wherein the optical element is oriented perpendicular to the laser duct, wherein the optical element divides the laser duct into a first laser duct part and a second laser duct part, wherein the first laser duct part is located closer to the holding nozzle and the second laser duct part is located farther away from the holding nozzle, and wherein the vacuum/pressure channel extends through the main body from the vacuum source to the first laser duct part.

6. The bonding head of claim 5, further comprising:

a fluid/pressure source configured to introduce a pressurized fluid into the second laser duct part, wherein the optical element is flexible such that a positive pressure created by the fluid/pressure source in the second laser duct part compared to the first laser duct part causes the optical element to curve.

7. The bonding head of claim 1, wherein the holding nozzle is configured to hold the substrate over a mounting face of a second substrate such that the nozzle exit is oriented parallel to the mounting face.

8. The bonding head of claim 1, wherein the holding nozzle is configured to hold the substrate over a mounting face of a second substrate such that the nozzle exit is oriented perpendicular to the mounting face.

9. The bonding head of claim 1, wherein the nozzle duct and the laser duct are aligned with one another, and wherein the holding nozzle is configured to hold the substrate over a mounting face of a second substrate such that the laser duct and the nozzle duct extend at an oblique angle to the mounting face.

10. The bonding head of claim 1, wherein the holding nozzle is configured to hold the substrate over a mounting face of a second substrate such that the laser duct extends at a first oblique angle to the mounting face and such that the nozzle duct extends at a second oblique angle to the mounting face, and wherein the first oblique angle is not equal to the second oblique angle.

11. The bonding head of claim 8, wherein the nozzle duct is configured to reflect the laser beam coming from the laser duct towards the nozzle exit.

12. A bonding apparatus comprising:

a bonding head body through which a laser duct extends from a laser entry to a laser exit;

a laser source that directs a laser beam through the laser duct towards the laser exit;

a vacuum source configured to generate a suction in the laser duct;

a pressure source configured to introduce a pressurized gas into the laser duct when a first substrate is being held at a nozzle exit and the laser beam is being directed towards the first substrate;

a holding nozzle connected to the bonding head body, wherein a nozzle duct extends through the holding nozzle from a nozzle entry to the nozzle exit, wherein the laser duct is coupled to the nozzle duct, wherein the nozzle entry is adjacent to the laser exit, wherein the holding nozzle is configured to hold the first substrate at the nozzle exit when the vacuum source generates the suction in the laser duct, wherein the laser beam passes through the nozzle duct and is directed towards the first substrate, and wherein the holding nozzle and the bonding head body are configured to be movable along a Z-axis perpendicular to an XY-plane; and a chuck configured to hold a second substrate and to be movable in the XY-plane.

13. The bonding apparatus of claim 12, wherein the holding nozzle and the bonding head body are configured to be tiltable with respect to the Z-axis.

14. The bonding apparatus of claim 12, wherein the holding nozzle is configured to hold the first substrate in a specific three-dimensional positional relationship to the second substrate such that the laser beam can melt bonding material disposed between the first substrate and the second substrate.

15. The bonding apparatus of claim 12, further comprising:

a first substrate carrier configured to store the first substrate and to be movable in the XY-plane.

16. The bonding apparatus of claim 12, wherein the vacuum source and the pressure source are embodied in a single unit, and wherein the single unit can be controlled to switch between generating the suction and introducing the pressurized gas.

17. The bonding apparatus of claim 12, wherein the holding nozzle is made of an opaque material that is not laser-transmissive.

18. The bonding apparatus of claim 12, wherein the nozzle exit has a cross-section dimension, wherein the first substrate has a holding face with a face dimension, and wherein the holding nozzle is adapted such that the cross-section dimension of the nozzle exit corresponds to the face dimension of the holding face.

19. The bonding apparatus of claim 12, wherein the holding nozzle is configured to hold the first substrate over a mounting face of a second substrate such that when the pressurized gas is introduced into the laser duct, the first substrate is pressed against the mounting face of the second substrate.

20. The bonding apparatus of claim 12, wherein the holding nozzle is configured to hold the first substrate over a mounting face of a second substrate such that the nozzle exit is oriented perpendicular to the mounting face.

21. The bonding apparatus of claim 12, wherein the nozzle duct and the laser duct are aligned with one another, and wherein the holding nozzle is configured to hold the first substrate over a mounting face of a second substrate such that the laser duct and the nozzle duct extend at an oblique angle to the mounting face.

* * * * *